United States Patent
Matero et al.

(10) Patent No.: US 10,056,249 B2
(45) Date of Patent: *Aug. 21, 2018

(54) ATOMIC LAYER DEPOSITION OF ANTIMONY OXIDE FILMS

(71) Applicant: ASM International N.V., Almere (NL)

(72) Inventors: Raija H. Matero, Helsinki (FI); Linda Lindroos, Helsinki (FI); Hessel Sprey, Kessel-Lo (BE); Jan Willem Maes, Wilrijk (BE); David de Roest, Kessel-Lo (BE); Dieter Pierreux, Dilbeek (BE); Kees van der Jeugd, Heverlee (BE); Lucia D'Urzo, Brussels (BE); Tom E. Blomberg, Vantaa (FI)

(73) Assignee: ASM International N.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/358,802

(22) Filed: Nov. 22, 2016

(65) Prior Publication Data

US 2017/0140918 A1    May 18, 2017

Related U.S. Application Data

(63) Continuation of application No. 14/658,000, filed on Mar. 13, 2015, now Pat. No. 9,514,934, which is a
(Continued)

(51) Int. Cl.
*H01L 21/302*    (2006.01)
*H01L 21/02*    (2006.01)
(Continued)

(52) U.S. Cl.
CPC .... *H01L 21/0228* (2013.01); *H01L 21/02175* (2013.01); *H01L 21/02274* (2013.01);
(Continued)

(58) Field of Classification Search
CPC ......... H01L 21/02175; H01L 21/02274; H01L 21/02281; H01L 21/2225; H01L 29/517;
(Continued)

(56) References Cited

U.S. PATENT DOCUMENTS

| 4,629,501 A | 12/1986 | Kubota et al. |
| 4,663,192 A | 5/1987 | Hatakeyama et al. |

(Continued)

FOREIGN PATENT DOCUMENTS

| JP | 2004056142 | 2/2004 |
| JP | 2004-072068 | 3/2004 |

(Continued)

OTHER PUBLICATIONS

Kalkofen et al., "Atomic Layer Deposition of Antimony Oxide on Hydrogen-terminated Silicon Substances", ECS Transactions, vol. 19, No. 1, pp. 105-114, (2009), Supporting information is also included in 1 page.

(Continued)

*Primary Examiner* — Lan Vinh
(74) *Attorney, Agent, or Firm* — Knobbe, Martens, Olson & Bear, LLP

(57) ABSTRACT

Antimony oxide thin films are deposited by atomic layer deposition using an antimony reactant and an oxygen source. Antimony reactants may include antimony halides, such as $SbCl_3$, antimony alkylamines, and antimony alkoxides, such as $Sb(OEt)_3$. The oxygen source may be, for example, ozone. In some embodiments the antimony oxide thin films are deposited in a batch reactor. The antimony oxide thin films may serve, for example, as etch stop layers or sacrificial layers.

20 Claims, 9 Drawing Sheets

Related U.S. Application Data continuation of application No. 13/649,992, filed on Oct. 11, 2012, now Pat. No. 9,006,112.

(60) Provisional application No. 61/597,373, filed on Feb. 10, 2012, provisional application No. 61/546,500, filed on Oct. 12, 2011.

(51) Int. Cl.
| | |
|---|---|
| *H01L 21/033* | (2006.01) |
| *H01L 21/311* | (2006.01) |
| *H01L 21/28* | (2006.01) |
| *H01L 29/51* | (2006.01) |
| *H01L 21/22* | (2006.01) |
| *C23F 1/26* | (2006.01) |

(52) U.S. Cl.
CPC ...... *H01L 21/0332* (2013.01); *H01L 21/2225* (2013.01); *H01L 21/28194* (2013.01); *H01L 21/31111* (2013.01); *H01L 21/31122* (2013.01); *H01L 29/513* (2013.01); *H01L 29/517* (2013.01); *C23F 1/26* (2013.01)

(58) Field of Classification Search
CPC ............. H01L 21/0228; H01L 21/0332; H01L 21/28194; H01L 21/31111; H01L 21/31122; H01L 29/513; C23F 1/20; C23F 1/26
USPC ....... 438/694, 697, 720, 722, 741, 754, 756, 438/761, 778
See application file for complete search history.

(56) References Cited

U.S. PATENT DOCUMENTS

| | | | |
|---|---|---|---|
| 7,250,379 B2 | 7/2007 | Lee et al. | |
| 7,425,514 B2 | 9/2008 | Yeo et al. | |
| 7,498,643 B2 | 3/2009 | Kamimuta et al. | |
| 7,560,792 B2 | 7/2009 | Khamankar et al. | |
| 7,605,094 B2 | 10/2009 | Lee et al. | |
| 7,700,496 B2 | 4/2010 | Kim et al. | |
| 7,943,502 B2 | 5/2011 | Park et al. | |
| 8,507,040 B2 * | 8/2013 | Xiao .................... | C23C 16/305 427/248.1 |
| 8,637,942 B2 | 1/2014 | Kim et al. | |
| 8,980,679 B2 | 3/2015 | Im et al. | |
| 9,154,934 B2 * | 10/2015 | Yang .................... | H04W 8/005 |
| 2002/0148736 A1 * | 10/2002 | Zolotarsky .......... | C25B 11/0484 205/505 |
| 2004/0009679 A1 | 1/2004 | Yeo et al. | |
| 2005/0110145 A1 | 5/2005 | Elers | |
| 2005/0277223 A1 | 12/2005 | Lee et al. | |
| 2006/0292880 A1 | 12/2006 | Son et al. | |
| 2008/0020133 A1 * | 1/2008 | Kobori ................ | C23C 18/1216 427/126.4 |
| 2008/0108165 A1 | 5/2008 | Lutz et al. | |
| 2008/0254231 A1 * | 10/2008 | Lin ....................... | C23C 16/403 427/576 |
| 2009/0305458 A1 | 12/2009 | Hunks et al. | |
| 2010/0317150 A1 * | 12/2010 | Hunks .................. | C07C 251/08 438/102 |
| 2011/0001420 A1 | 1/2011 | Tchakarov et al. | |
| 2012/0128867 A1 | 5/2012 | Paulson | |

FOREIGN PATENT DOCUMENTS

| | | |
|---|---|---|
| JP | 2005-354076 | 12/2005 |
| JP | 2005354076 | 12/2005 |
| JP | 2007-049001 | 2/2007 |
| JP | 2008-311664 | 12/2008 |
| JP | 2010059546 | 3/2010 |
| WO | WO 01/084610 | 11/2001 |
| WO | WO 2011/056519 | 5/2011 |

OTHER PUBLICATIONS

Kalkofen et al., "Investigation of Antimony Oxide Films Deposited by Atomic Layer Deposition", ECS Transactions, vol. 45, No. 3, pp. 461-473, (2012).

Yang et al., "Atomic Layer Deposition of Antimony Oxide and Antimony Sulfide", Chem. Mater., vol. 21, No. 13, pp. 2586-2588, (2009), Supporting information is also included in 2 pages.

Yang, R.B., "Gas-Phase Synthesis of Bismuth and Antimony Chalcogenide Nanostructures", Dissertation, Bochum, May 2010, 177 pages.

Notification of Reasons for Refusal dated Sep. 27, 2016 in Japanese Application No. 2012-225541.

* cited by examiner

FIG 1A.
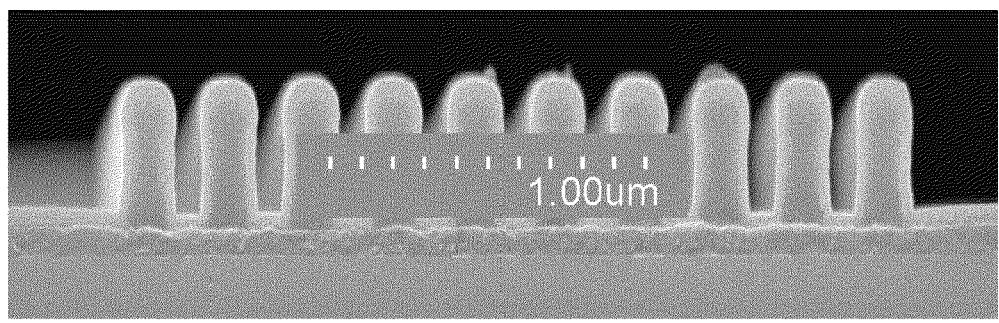
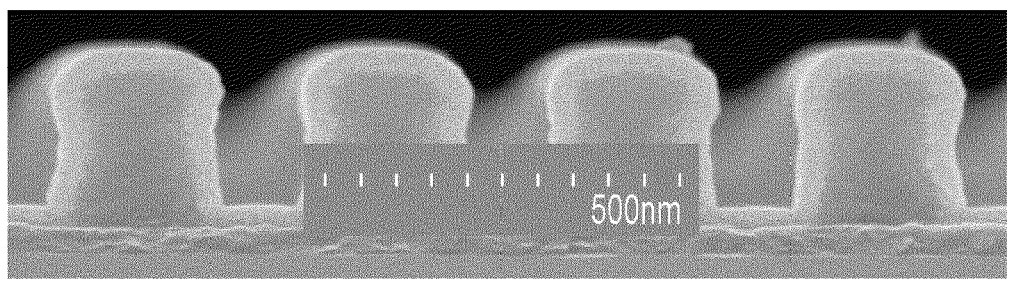
FIG 1B.

ATOMIC LAYER DEPOSITION OF ANTIMONY OXIDE FILMS

CROSS-REFERENCE TO RELATED APPLICATIONS

This application is a continuation of U.S. patent application Ser. No. 14/658,000, filed Mar. 13, 2015, which is a continuation of U.S. patent application Ser. No. 13/649,992, filed Oct. 11, 2012, and now issued as U.S. Pat. No. 9,006,112, which claims priority to U.S. Provisional application No. 61/546,500, filed Oct. 12, 2011 and U.S. Provisional application No. 61/597,373, filed Feb. 10, 2012, the disclosures of which are incorporated herein by reference in their entirety.

BACKGROUND OF THE INVENTION

Field of the Invention

The present application relates to deposition of $Sb_2O_3$ films by atomic layer deposition.

SUMMARY OF THE INVENTION

Antimony oxide thin films can be deposited by atomic layer deposition (ALD). In one aspect, antimony oxide thin films are deposited from alternating and sequential pulses of an antimony source and an oxygen source.

In some embodiments the antimony source comprises an antimony halide, an antimony alkoxide or an antimony alkylamine compound. The oxygen source may be, for example, ozone. In some embodiments the oxygen source comprises plasma. In some embodiments the oxygen source is not water.

In some embodiments antimony oxide thin films are deposited using an ALD cycle comprising alternating and sequential pulses of an antimony alkoxide and an oxygen source, such as ozone. The antimony alkoxide may be, for example, $Sb(OEt)_3$. The films may be deposited in a batch reactor or a single-wafer reactor and may be used, for example, as a sacrificial layer or as an etch stop layer.

In some embodiments antimony oxide thin films are deposited by an ALD cycle comprising alternating and sequential pulses of an antimony alkylamine and an oxygen source, such as ozone. The films may be deposited in a single-wafer reactor or a batch reactor and may be used, for example, as a sacrificial layer or as an etch stop layer.

In some embodiments, pulses of water may be included in the deposition process. When water is included, the oxygen source is not water.

In another aspect, antimony oxide thin films are deposited by an ALD process comprising alternating and sequential pulses of an antimony precursor and water. In some embodiments the antimony precursor is an antimony halide, an antimony alkylamine or an antimony alkoxide.

In some embodiments the antimony halide reactant may be $SbCl_3$. In some embodiments the antimony alkoxide reactant may be $Sb(OEt)_3$. In some embodiments the antimony alkylamine reactant may be $Sb(N(CH3_2)_2)_3$.

In some embodiments the stoichiometry of the antimony oxide deposited by ALD may be $SbO_x$, where x is from about 1 to about 3. In some embodiments the stoichiometry of the antimony oxide may be $Sb_2O_3$, $Sb_2O_5$ or mixtures thereof. In some embodiments the stoichiometry of the antimony oxide is $Sb_2O_3$. In other embodiments the stoichiometry of the antimony oxide is $Sb_2O_5$. In some embodiments the stoichiometry of the antimony oxide is a mixture of $Sb_2O_3$ and $Sb_2O_5$. In other embodiments the antimony oxide has a different stoichiometry.

In some embodiments the ALD process is a thermal ALD process. In some embodiments the ALD process is a plasma enhanced ALD process (PEALD).

In some embodiments the ALD process is carried out in a batch reactor. In some embodiments the ALD process is carried out in a single wafer reactor.

In some embodiments the antimony oxide may be doped with another material, such as a different metal or metal oxide. That is, at least one metal of the different metal or metal oxide is not antimony. For example, the antimony oxide may be doped with aluminum oxide ($Al_2O_3$).

In some embodiments, antimony oxide films deposited by ALD are used in solid state doping applications, such as in the formation of FinFets. For example, antimony oxide may be deposited on silicon and temperature can be used to drive dopant (Sb) into the underlying silicon. A sharp dopant (Sb) profile may be obtained, as the diffusion coefficient is magnitudes lower than that of P.

In some embodiments a method of doping a material such as a silicon substrate comprises depositing antimony oxide by ALD directly over and contacting the material and anneal to drive the dopant from the antimony oxide layer into the underlying material.

In some embodiments, antimony oxide thin films deposited by ALD may be used as a p-type cap layer in PMOS. For example, a thin layer of antimony oxide can be deposited by ALD on a gate dielectric, thereby shifting the threshold voltage toward p-type. In some embodiments a $Si/SiO_2/HfO_2/SbO_x/TiN$ structure is formed.

In some embodiments, antimony oxide thin films deposited by ALD can be used as a sacrificial layer (for example deposited on a resist) for double or quadruple patterning. A method of multiple patterning may comprise depositing a conformal antimony oxide layer over a patterned resist layer on a substrate by ALD, etching the antimony oxide layer, removing the resist and etching the substrate. In some embodiments an antimony oxide thin film deposited by ALD is used as an etch stop layer.

In some aspects antimony oxide thin films deposited by ALD can be used to form structures on a semiconductor substrate. A first layer comprising a first material is deposited on a substrate. A second layer of antimony oxide is deposited on the substrate by ALD. The ALD process may comprise alternately and sequentially contacting the substrate with an antimony precursor and an oxygen precursor. The first or second layer is subsequently etched. In some embodiments the first layer comprising the first material is selectively etched relative to the second antimony oxide layer. In other embodiments the second antimony oxide layer is selectively etched relative to the first layer. The first layer may comprise, for example, $SiO_2$ or $Al_2O_3$. The ALD process for depositing the second antimony oxide film may be carried out in a batch reactor in some embodiments. In some embodiments the second layer comprising antimony oxide is deposited prior to depositing the first layer comprising a first material. For example, the second layer may be deposited directly on the first layer.

BRIEF DESCRIPTION OF THE DRAWINGS

The invention will be better understood from the detailed description of some of the embodiments and from the appended drawings, which are meant to illustrate and not to limit the invention, and wherein:

FIGS. 1A and B show $Sb_2O_3$ layers deposited on structured photoresist.

DETAILED DESCRIPTION

Figure 2A:
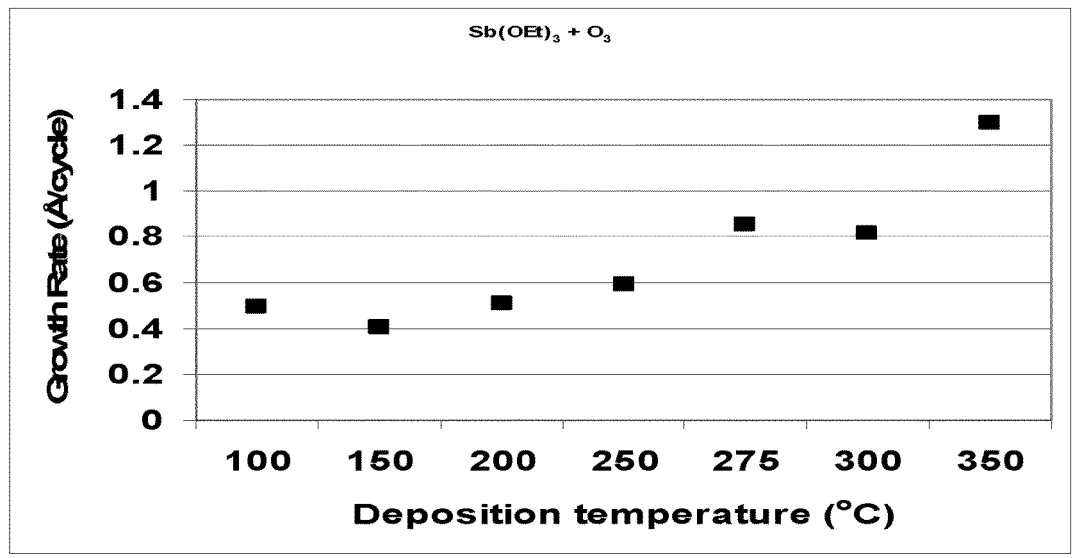
FIG. 2A shows the growth rate of $Sb_2O_3$ films deposited from $Sb(OEt)_3$ and $O_3$ as a function of temperature.

Antimony oxide films ($SbO_x$) can be deposited by atomic layer deposition processes using antimony precursors and oxygen source reactants. In some embodiments antimony precursors may be antimony halides, antimony alkoxides and/or antimony alkylamines. For example, in some embodiments, $Sb_2O_3$ films can be deposited by ALD using $Sb(OC_2H_5)_3$ and $O_3$. In some embodiments $Sb_2O_3$ films are deposited by ALD using $SbCl_3$ and $O_3$.

Antimony oxide deposited by ALD can be used in a variety of contexts, for example as a p-type capping layer, in solid state doping applications as a dopant source for doping underlying silicon and in multiple patterning applications. The antimony oxide can be used as a sacrificial layer as there are differences in etching properties compared to $SiO_2$.

The thickness and composition of the antimony oxide films can be controlled to produce a film with the desired characteristics. Antimony oxide is generally referred to herein as $SbO_x$. However, the exact stoichiometry can vary. In some embodiments, X can be about 1 to about 3, or about 1.2 to about 2.5. In some embodiments the stoichiometry of the antimony oxide is $Sb_2O_3$. In other embodiments the stoichiometry of the antimony oxide is $Sb_2O_5$. In some embodiments the stoichiometry of the antimony oxide is a mixture of $Sb_2O_3$ and $Sb_2O_5$. In some embodiments the antimony oxide has a different stoichiometry.

ALD type processes are based on controlled, self-limiting surface reactions of precursor chemicals. Gas phase reactions are avoided by contacting the substrate alternately and sequentially with the precursors. Vapor phase reactants are separated from each other in the reaction chamber, for example, by removing excess reactants and/or reactant byproducts from the reaction chamber between reactant pulses.

The methods presented herein allow deposition of antimony oxide films on substrate surfaces. Geometrically challenging applications are also possible due to the nature of the ALD-type processes and the ability to deposit conformal thin films. According to some embodiments, atomic layer deposition (ALD) type processes are used to form antimony oxide films on substrates such as integrated circuit workpieces.

A substrate or workpiece is placed in a reaction chamber and subjected to alternately repeated surface reactions. In particular, in some embodiments thin films are formed by repetition of a self-limiting ALD cycle. Preferably, each ALD cycle comprises at least two distinct phases. In a first phase, one reactant will form no more than about one monolayer on the substrate surface. This reactant includes antimony. This reactant, also referred to herein as "the antimony reactant" or "antimony precursor" may be, for example, an antimony halide, antimony alkoxide or antimony alkylamide. A second reactant comprising oxygen (the "oxygen source") is provided and reacts with the adsorbed antimony precursor to form an antimony oxide. The oxygen source may comprise plasma in some embodiments. Exemplary oxygen sources include water, ozone and oxygen plasma. A third reactant may be included in some embodiments, for example to enhance the growth of the antimony oxide. In some embodiments, the third reactant may be water. Although referred to as the first and second phases and the first, second and third reactant, an ALD cycle may begin with any one of the reactants.

In some embodiments the substrate on which deposition is desired, preferably a semiconductor workpiece, is loaded into a reactor. The reactor may be part of a cluster tool in which a variety of different processes in the formation of an integrated circuit are carried out. In some embodiments a flow-type reactor is utilized. In some embodiments a high-volume manufacturing capable single wafer ALD reactor is used.

In other embodiments a batch reactor comprising multiple substrates is used. For some embodiments in batch ALD reactors, the number of substrates is preferably in the range of 10 to 200, more preferably in the range of 50 to 150, and most preferably in the range of 100 to 130. In some embodiments a batch reactor is used with more than 50 wafers, more than 100 wafers or more than 150 wafers. In some embodiments a vertical batch reactor is utilized in which the boat rotates during processing, such as the A412™ reactor from ASM Europe B.V. (Almere, Netherlands). Thus, in some embodiments the wafers rotate during processing.

Exemplary single wafer reactors, designed specifically to enhance ALD processes, are commercially available from ASM America, Inc. (Phoenix, Ariz.) under the tradenames Pulsar® 2000 and Pulsar® 3000. Exemplary batch ALD reactors, designed specifically to enhance ALD processes, are commercially available from and ASM Europe B.V (Almere, Netherlands) under the tradenames A4ALD™ and A412™. In some embodiments an F450™ ALD reactor supplied by ASM Microchemistry Oy, Espoo is used. Other reactors that can be used or modified to be used will be apparent to the skilled artisan.

In some embodiments the substrate is a 300 mm wafer. In other embodiments the substrate is a 450 mm wafer. These large wafers may be used in single wafer reactors or in batch reactors.

In some embodiments the maximum with-in-wafer thickness non-uniformities for the antimony oxide films deposited by ALD are less than about 15% (1σ), less than about 10%, less than about 5% or less than about 3%. In some embodiments in which a batch reactor is used, wafer-to-wafer uniformity is less than about 3% (1σ), less than 2%, less than 1% or even less than 0.5%.

As mentioned briefly above, the ALD processes disclosed herein also allow for conformal deposition on three-dimensional structures. In some embodiments step coverage of a deposited $SbO_x$ film on a three-dimensional structure is greater than 50%, greater than 80%, greater than 90% or even greater than 95%.

In some embodiments, if necessary, the exposed surfaces of the workpiece can be terminated to react with the first phase of the ALD process. In some embodiments a separate termination step is not required.

As discussed in more detail below, in some embodiments, one or more $SbO_x$ deposition cycles begin with provision of the antimony precursor, followed by the oxygen source. In other embodiments deposition may begin with provision of the oxygen source, followed by the antimony precursor. The reaction chamber is typically purged between reaction pulses. The cycle is repeated until a film of the desired thickness is obtained. In some embodiments, one or more cycles within the ALD process are varied to obtain a film with a desired composition.

In some embodiments, the antimony precursor is provided first. After the initial surface termination, if necessary or desired, a first antimony precursor pulse is supplied to the workpiece. In accordance with some embodiments, the first reactant pulse comprises a carrier gas flow and a volatile antimony species, such as $SbCl_3$ or $Sb(OEt)_3$, that is reactive with the workpiece surfaces of interest. Accordingly, the antimony reactant adsorbs upon the workpiece surfaces. The first reactant pulse self-saturates the workpiece surfaces such that any excess constituents of the first reactant pulse do not further react with the molecular layer formed by this process.

The first antimony reactant pulse is preferably supplied in gaseous form. The antimony reactant gas is considered "volatile" for purposes of the present description if the species exhibits sufficient vapor pressure under the process conditions to transport the species to the workpiece in sufficient concentration to saturate exposed surfaces.

The antimony reactant is pulsed for a time period sufficient to saturate the substrate surface to a desired extent.

After sufficient time for a molecular layer to adsorb on the substrate surface, excess first reactant is then removed (purged) from the reaction space. In some embodiments the flow of the first reactant is stopped while continuing to flow a carrier gas or purge gas for a sufficient time to diffuse or purge excess reactants and reactant by-products, if any, from the reaction space. Provision and removal of the antimony reactant can be referred to as the antimony phase of the ALD cycle.

An oxygen source (second reactant) is pulsed into the reaction space to contact the substrate surface and react with the adsorbed antimony precursor to form an antimony oxide layer. The oxygen source may comprise, for example, ozone, water or oxygen radicals. Oxygen source concentration and pulsing time can also be determined based on the particular circumstances. In some embodiments, the oxygen source concentration may be about 10 to about 400 $g/m^3$ (NTP), or from about 60 to about 300 $g/m^3$. The flow rate of the oxygen source into the chamber may be, for example, from about 100 to about 1000 $cm^3/min$ (NTP), or from about 200 to 800 $cm^3/min$.

After a time period sufficient to completely saturate and react the molecular layer with the oxygen pulse, any excess second, oxygen reactant is removed from the reaction space. As with the removal of the first reactant, this step may comprise flowing a purge gas for a time period sufficient for excess reactive species and volatile reaction by-products to be purged from the reaction space. Together, the oxygen reactant provision and removal represent a second phase in process, and can also be considered the oxygen phase.

The antimony phase and the oxygen phase together represent one ALD cycle, which is repeated to form antimony oxide thin films of the desired thickness. Although the oxygen phase may also be described as an 'oxidation' phase, one skilled in the art will understand that oxidation reactions, i.e. oxidation state changes, are not necessarily taking place. Unless otherwise indicated, the term oxidation phase is used to refer to the phase where the oxygen source is provided and removed to/from the reaction space.

As discussed below, in some embodiments a third phase by be included, in which water (or another reactant) is pulsed to the substrate. A vapor phase pulse of water is provided to the reaction space, allowed to react, and then removed from the reaction space, such as by purging with an inert gas. In some embodiments the water phase is provided after the antimony phase and prior to the oxidation phase. In other embodiments the water phase is provided after the oxidation phase and subsequent to the next antimony phase. When water is used, the oxidation phase utilizes an oxygen source other than water.

The exact pulsing times for the antimony reactant and oxygen source can be determined based on the particular circumstances. In some embodiments the pulse time for the antimony reactant and/or the oxygen source is about 0.05 to 180 seconds, 0.1 to 50 seconds, 1 to 10 seconds or about 2 seconds. Depending on the reactor type, substrate type and its surface area, the pulsing time for the antimony reactant and oxygen precursor may be even higher than 180 seconds. In some embodiments, pulsing times can be on the order of minutes. The optimum pulsing time can be readily determined by the skilled artisan based on the particular circumstances.

Typical purging times are from about 0.05 to 20 seconds, for example between about 1 and 10, or even between about 1 and 2 seconds. However, other purge times can be utilized if necessary, such as when depositing layers over extremely high aspect ratio structures or other structures with complex surface morphology is needed.

In some embodiments using a batch reactor, antimony reactant pulse times are about 1 to about 60 seconds, the antimony reactant is purged for about 5 to about 600 seconds, the oxygen source is pulsed for about 1 to about 60 seconds and the oxygen source is removed by purging for about 5 to about 600 seconds.

While the ALD cycle is generally referred to herein as beginning with the antimony phase, it is contemplated that in other embodiments the cycle may begin with the oxygen phase. One of skill in the art will recognize that the first reactant phase generally reacts with the termination left by the last phase in the previous cycle, if any. Thus, while no reactant may be previously adsorbed on the substrate surface or present in the reaction space if the oxygen phase is the first phase in the first ALD cycle, in subsequent cycles the oxygen phase will effectively follow the antimony phase.

In some embodiments, an antimony phase comprises providing a pulse of an antimony halide, such as $SbCl_3$, an antimony alkylamine or an antimony alkoxide, such as $Sb(OEt)_3$. Excess antimony precursor is removed and the precursor is contacted with a pulse of an oxygen source, such as ozone or water to form a layer of antimony oxide.

As mentioned above, each pulse or phase of each ALD cycle is typically self-limiting. An excess of reactants is supplied in each phase to saturate the susceptible structure surfaces. Surface saturation ensures reactant occupation of all available reactive sites (subject, for example, to physical size or "steric hindrance" restraints) and thus ensures excellent step coverage. However, in some embodiments the reaction conditions may be manipulated such that one or more of the phases is not self-limiting.

According to one embodiment, an antimony oxide thin film is formed on a substrate by an ALD type process comprising multiple antimony oxide deposition cycles, each deposition cycle comprising:

contacting a substrate with a vaporized antimony compound such that the antimony compound adsorbs to the substrate;

Removing excess antimony compound and reaction byproducts, if any;

contacting the substrate with an oxygen source, thereby converting the adsorbed antimony compound into antimony oxide; and removing excess unreacted oxygen source and reaction byproducts.

The contacting and removing steps are repeated until a thin film of a desired thickness and composition is obtained.

As discussed above, the deposition process typically comprises multiple ALD deposition cycles. In some embodiments, the antimony oxide may be doped, for example with a metal or metal oxide, such as aluminum oxide. Thus, in some embodiments antimony oxide deposition cycles may be provided at a desired ratio with metal or metal oxide deposition cycles. The ratio of antimony oxide deposition cycles to metal or metal oxide deposition cycles may be selected to control the dopant concentration in the ultimate antimony oxide film deposited by the ALD process. For example, for a low dopant density, the ratio of antimony oxide cycles to metal or other metal oxide deposition cycles may be on the order of 10:1. For a higher concentration of dopant, the ratio may range up to about 1:1 or greater.

In addition, the density of a dopant can be varied across the thickness of the film by changing the ratio of antimony oxide cycles to dopant deposition cycles during the deposition process.

Deposition temperatures are maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved. Here, the temperature is preferably at or below about 500° C. In some embodiments the deposition temperature is about 50 to about 400° C. For $SbCl_3$, the deposition temperature is preferably at or above about 35° C., for example about 35° C. to about 500° C. For $Sb(OEt)_3$, the deposition temperature is preferably at or above about room temperature, for example about room temperature to about 500° C.

In some embodiments in which a batch reactor is used the deposition temperature is between about 20° C. and about 500° C., between about 100° C. and about 400° C., between about 120° C. and about 300° C. or between about 150° C. and about 250° C.

The deposition processes can be carried out at a wide range of pressure conditions, but it is preferred to operate the processes at reduced pressure. The pressure in the reaction chamber is typically from about 0.01 to about 500 mbar or more. However, in some cases the pressure will be higher or lower than this range, as can be readily determined by the skilled artisan. In some embodiments the pressure in a single wafer reactor is maintained between about 0.01 mbar and 50 mbar, or between about 0.1 mbar and 10 mbar. In some embodiments the pressure in a batch ALD reactor is maintained between about 1 mTorr and 500 mTorr, or between about 30 mTorr and 200 mTorr.

The antimony source temperature is preferably set below the deposition or substrate temperature. This is based on the fact that if the partial pressure of the source chemical vapor exceeds the condensation limit at the substrate temperature, controlled layer-by-layer growth of the thin film is compromised. For example, for $SbCl_3$ the source temperature is about 35° C. in some embodiments while for $Sb(OEt)_3$ the source temperature is about room temperature in some embodiments.

In some embodiments, the deposited antimony oxide thin films have step coverage of greater than about 80%, greater than about 90%, greater than about 95% or step coverage of about 100%.

In general, the source materials, (e.g., antimony source materials), are preferably selected to provide sufficient vapor pressure, sufficient thermal stability at substrate temperature, and sufficient reactivity of the compounds for effecting deposition by ALD. "Sufficient vapor pressure" typically supplies enough source chemical molecules in the gas phase to the substrate surface to enable self-saturated reactions at the surface at the desired rate. "Sufficient thermal stability" typically means that the source chemical itself does not form growth-disturbing condensable phases on the surface or leave harmful level of impurities on the substrate surface through thermal decomposition. In other words, temperatures are kept above the condensation limits and below the thermal decomposition limits of the selected reactant vapors. One aim is to avoid uncontrolled condensation of molecules on the substrate. "Sufficient reactivity" typically results in self-saturation in pulses short enough to allow for a commercially acceptable throughput time. Further selection criteria include the availability of the chemical at high purity and the ease of handling of the chemical.

In some embodiments the antimony reactant comprises an antimony halide. For example, the antimony halide may be $SbCl_3$. In other embodiments the antimony halide may be $SbBr_3$, $SbF_3$ or $SbI_3$. In some embodiments the antimony halide comprises at least one halide ligand. In some embodiments the antimony halide is $SbX_zA_{3-z}$, wherein z is from 1 to 3 and A is a ligand comprising alkylamine, a halide different from X, or an amine, silyl, alkoxide or alkyl group.

In some embodiments the antimony reactant comprises an antimony alkoxide. For example, the antimony reactant may comprise $Sb(OEt)_3$. In some embodiments the antimony reactant may comprise $Sb(OR)_3$, wherein each R can be independently selected to be a linear, branched, or cyclic, saturated or unsaturated, C1-C12 alkyl or alkenyl group. The alkyl or alkenyl might also be substituted with substituents such as halogens, amines, silyls etc. In some embodiments the antimony reactant may comprise $Sb(OR)_xA_{3-x}$, wherein x is from 1 to 3, each R can be independently selected to be a linear or branched, cyclic or linear, saturated or unsaturated, C1-C12 alkyl or alkenyl group. The alkyl or alkenyl might also be substituted with substituents like halogens, amines, silyls. A is ligand comprising alkylamine, halide, amine, silyl or alkyl.

While antimony oxide can be deposited using antimony halides or antimony alkoxides as antimony sources, as described above, in some embodiments other types of antimony sources can be used, such as antimony alkylamines and antimony alkyls. For example, alternative antimony sources can be used in specific applications, such as deposition of antimony oxide films to serve as sacrificial layers. The sacrificial layers may be used, for example, in double or quadruple patterning.

In some embodiments antimony alkylamines are used. The antimony reactant may comprise, for example, $Sb(NR_2)_xA_{3-x}$, wherein x is from 1 to 3, and each R can be independently selected to be linear, branched or cyclic, saturated or unsaturated, C1-C12 alkyl or alkenyl group or hydrogen if the other R is not hydrogen. In some embodiments the alkyl or alkenyl might also be substituted with substituents such as halogens, amines, silyls etc. . . . A can be a ligand comprising alkylamine, halide, amine, silyl or alkyl. A specific example of this kind precursor is tris(dimethylamine)antimony, $Sb(NMe_2)_3$. Other non-limiting examples are C2-C3 variants: $Sb(NEt_2)_3$, $Sb(NPr_2)_3$ and $Sb(N^iPr_2)_3$. The R in $Sb(NR_2)_3$ can be linear or branched, cyclic or linear, saturated or unsaturated, C1-C12 alkyl or alkenyl group. The alkyl or alkenyl might also be substituted with substituents like halogens, amines, silyls etc.

Another type of antimony compounds that can be used are antimony alkyls having the formula $SbR_xA_{3-x}$, wherein x is from 1 to 3, each R can be independently selected to be a linear, branched, or cyclic, saturated or unsaturated, C1-C12 alkyl or alkenyl group. In some embodiments the alkyl or alkenyl can also be substituted with substituents like halogens, amines, silyls etc A is a ligand comprising alkylamine, halide, amine, silyl or alkyl.

While in some of the above-mentioned antimony compounds the oxidation state of antimony is +III, similar antimony compounds, such as alkoxides, halides, alkyls and alkylamines or mixtures or derivatives thereof, can be use that have different antimony oxidation states, like +V.

In some embodiments the oxygen source material is selected from the group consisting of water, oxygen, hydrogen peroxide, aqueous solution of hydrogen peroxide, ozone, atomic oxygen, oxides of nitrogen, peracids (—O—O—H), alcohols, oxygen-containing radicals and mixtures thereof. Other oxygen sources can also be employed, such as remotely or in situ generated oxygen plasma.

The oxygen source may be an oxygen-containing gas pulse and can be a mixture of oxygen and inactive gas, such as nitrogen or argon. In some embodiments the oxygen source may be a molecular oxygen-containing gas pulse. In some embodiments the oxygen content of the oxygen-source gas is from about 10 to 25%. Thus, one source of oxygen may be air. In some embodiments, the oxygen source is molecular oxygen. In some embodiments, the oxygen source comprises an activated or excited oxygen species.

In some embodiments, the oxygen source comprises ozone. The oxygen source may be pure ozone or a mixture of ozone, molecular oxygen, and another gas, for example an inactive gas such as nitrogen or argon. Ozone can be produced by an ozone generator and it is most preferably introduced into the reaction space with the aid of an inert gas of some kind, such as nitrogen, or with the aid of oxygen. In some embodiments, ozone is provided at a concentration from about 5 vol-% to about 40 vol-%, and preferably from about 15 vol-% to about 25 vol-%. In other embodiments, ozone is formed inside the reactor, for example by conducting oxygen containing gas through an arc.

In other embodiments, an oxygen containing plasma is formed in the reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of remote plasma, the pathway to the substrate can be optimized to maximize electrically neutral species and minimize ion survival before reaching the substrate.

In some embodiments water is not used as the oxygen source. In some embodiments water is used as an oxygen source. In other embodiments, water is used in combination with one or more additional oxygen sources. The water may be provided with the additional oxygen source or separately. In some embodiments a water pulse is provided prior to a pulse of a second oxygen source, such as ozone. In other embodiments, a water pulse is provided subsequent to a pulse of a second oxygen source, such as ozone. The reaction chamber may be purged between each pulse.

As mentioned above, in some embodiments, the antimony oxide film can be used as a dopant source for an underlying layer, such as for doping a semiconductor. For example, an antimony oxide can be deposited over another layer, such as a silicon layer, by an ALD process as disclosed herein and annealing can be carried out to drive dopant (Sb) into the underlying silicon layer. The semiconductor layer to be doped may be, for example, a fin of a finFET device.

In some embodiments an antimony oxide layer is deposited over a silicon substrate and annealed to drive dopant (Sb) into the silicon substrate.

In some embodiments, an antimony oxide layer can be used as a surface passivation film for c-Si based solar cells.

In some embodiments, an antimony oxide layer can serve as a p-type capping layer in PMOS. For example, a thin antimony oxide layer can be deposited on top of a gate dielectric. The antimony oxide layer may thus serve to shift the threshold voltage towards p-type. In some embodiments a multi-layer structure is deposited comprising $Si/SiO_2/HfO_2/SbO_x/TiN$, where at least the $SbO_x$ layer is deposited by ALD, as described herein.

In some embodiments, the antimony oxide thin films can be used in multiple patterning applications (such as double exposure, double development, spacer defined double patterning, triple and quadruple exposure etc. . . . ). The antimony oxide thin films may serve, for example as sacrificial layers or etch stop layers.

In part because of a delay in introduction of extreme ultraviolet lithography (EUV), double patterning is used to decrease the critical dimension (CD). One approach that is used is called spacer defined double patterning (SDDP). Briefly, a uniform, conformal layer is deposited on a patterned core (also called a mandrel or template) that can be, for example, amorphous carbon. After dry etch, spacers are created which act as a template/mask to form patterns in the lower layer(s). The spacer material layer thickness determines the CD and CD uniformity. A good within wafer uniformity is desired (3 SIGMA of 10% of the CD value is a good reference). In some embodiments, an antimony oxide layer is deposited by ALD as described herein as part of an SDDP process. The antimony oxide layer may serve, for example, as the conformal layer used to form the spacers.

In direct SDDP, the spacer is a conformal layer deposited directly on resist. Thus, a low-temperature process (such as below 150° C.) is used. The actual maximum temperature will vary depending on the type of resist. An advantage of direct SDDP is a decrease in the number of process steps compared to conventional SDDP. A challenge is finding a resist compatible deposition process. In some embodiments, the process described herein are operated at temperatures of less than 150° C., or less than the maximum temperature for a given resist, and thus can be used in this context. In some embodiments an SDDP process, or other process for forming structures on a semiconductor substrate, comprises depositing a conformal antimony oxide film by ALD as described herein and subsequently etching the antimony oxide film. In some embodiments a different film on the substrate is etched relative to the antimony oxide film.

Additionally, if the spacer has high etch selectivity relative to the template and underlying dielectric, and good mechanical properties (avoiding pattern collapse), a low aspect ratio resist can be used, thus facilitating lithography and integration. Currently, $SiO_2$ and SiN are used for forming spacer layers, but these have a challenging etch selectivity toward the template and/or underlying dielectric and thus require a high aspect ratio resist. In some embodiments $SbO_x$ films, such as $Sb_2O_3$ films, deposited by the disclosed methods have a more desirable etch selectivity and are used to form spacer layers. For example, experiments have shown that 1% HF, 25% $H_2SO_4$, conc. $HNO_3$, and 2M NaOH do not etch $SbO_x$, whereas it can be removed quickly with conc HCl (see Examples below). Compared to traditional SDDP approaches, this makes higher selectivity towards template and underlying material possible.

Because the $SbO_x$ deposition processes disclosed herein can, in some embodiments, be carried out at relatively low temperatures, for example below 150° C. or below 100° C., and can be used to form conformal films with uniform properties, in some embodiments they can be used for direct SDDP. Additionally, because the deposited films can have good mechanical properties and good etch selectivity, a low aspect ratio resist can be formed, thereby facilitating lithography and integration.

In some such embodiments, an antimony oxide layer is deposited conformally over a patterned resist by ALD. An example is illustrated in FIG. 1, where an $Sb_2O_3$ layer was deposited at 100° C. on structured photoresist.

The antimony oxide can be used as a sacrificial layer or etch stop layer. As mentioned above, there are differences in etching properties between $SbO_x$ films and $SiO_2$ and other materials such as $Al_2O_3$ deposited by ALD. For example, an $Sb_2O_3$ film deposited from $Sb(OEt)_3$ and $O_3$ could not be etched with 1% HF, 25% $H_2SO_4$, conc. $HNO_3$ or 2M NaOH. However, the film could be etched in conc. HCl at a rate of about 10 nm/min. Thus, in some embodiments $Sb_2O_3$ film deposited from $Sb(OEt)_3$ and $O_3$ can be selectively etched using HCl, or a different film can be selectively etched relative to the $Sb_2O_3$ film using 1% HF, 25% $H_2SO_4$, concentrated $HNO_3$ or 2M NaOH.

On the other hand, an $Sb_2O_3$ film deposited from $SbCl_3$ and $O_3$ could not be etched with 1% HF, 25% $H_2SO_4$, conc. HCl, or conc. $HNO_3$. Thus, in some embodiments a film that can be etched using one or more of these compounds can be selectively etched relative to the $Sb_2O_3$ film deposited from these precursors.

In addition it was found that while thermal $SiO_2$ etched with a rate of about 2.8 nm/min in HF solution, an $SbO_x$ film deposited as described herein did not show any notable etching in the same HF solution. Thus, in some embodiments HF is used to selectively etch $SiO_2$ relative to such $SbO_x$ films. On the other hand, $SbO_x$ films could be etched with $H_2O_2$ at a rate of about 1 to 2 nm/min, thermal $SiO_2$ does not etch with $H_2O_2$. Thus, in other embodiments such $SbO_x$ films can be selectively etched relative to thermal $SiO_2$ using $H_2O_2$.

$SbO_x$ films also have good etch selectivity against $Al_2O_3$ films, such as $Al_2O_3$ films deposited by ALD. $H_3PO_4$, HF, KOH and TMAH were found to etch $Al_2O_3$ films deposited by ALD, but did not etch $SbO_x$, while $Al_2O_3$ was not etched by $H_2O_2$, tartaric acid or conc. HCl. Thus, $SbO_x$ can be selectively etched relative to $Al_2O_3$ using $H_2O_2$, tartaric acid or conc. HCl while $Al_2O_3$ can be selectively etched relative to $SbO_x$ using $H_3PO_4$, HF, KOH or TMAH.

In some embodiments, after being deposited over a patterned resist layer, an antimony oxide layer is etched to expose the underlying resist. The resist is then removed and the underlying substrate etched to form the desired features.

Generally the higher the deposition temperature is for $SbO_x$ films the higher etch resistance they have, provided that the deposition is not out of the deposition window i.e. high enough temperature to get good quality, but low enough to prevent major decomposition of precursor(s) and thus preventing bad quality of the film, for example, impurities due decomposition.

In some embodiments $SbO_x$ films can selectively be etched relative to $SiO_2$ and Si films or layers. Etching may be performed in gas phase or in liquid phase as a "wet etch". Exemplary selective etch solutions, in which the etching can be performed selectively, include concentrated HCl, $H_2O_2$ and tartaric acid. Selectivity is preferably over 75% (etch rate difference of 1:3), over 80% (etch rate difference of 1:5), over 90% (etch rate difference of 1:10), and in some cases the selectivity can be over 95% (etch rate difference of 1:20) or even over 98% (etch rate difference 1:50). In some embodiments the etch rate difference can be 1:100 (selectivity of 99%) or even more.

In some embodiments $SiO_2$ films can selectively be etched relative to $SbO_x$ films or layers deposited as described herein. Etching may be performed in gas phase or in liquid phase as a "wet etch". Exemplary etch solutions, in which the etching can be performed selectively include HF containing solutions, such as 0.5% or 1.0% diluted HF. Selectivity may be over 75% (etch rate difference of 1:3), over 80% (etch rate difference of 1:5), over 90% (etch rate difference of 1:10), and in some cases over 95% (etch rate difference of 1:20) or even over 98% (etch rate difference of 1:50). In some embodiments a selectivity of 99% or even higher can be obtained (such as an etch rate difference of 1:100).

In some embodiments $SbO_x$ films can be selectively etched relative to $Al_2O_3$ films or layers. Etching may be performed in gas phase or in liquid phase as a "wet etch". Exemplary selective etch solutions include concentrated HCl, $H_2O_2$ and tartaric acid. Selectivity may be over 75% (etch rate difference of 1:3), over 80% (etch rate difference of 1:5), over 90% (etch rate difference of 1:10), or even over 95% (etch rate difference of 1:20) or 98% (etch rate difference of 1:50). In some cases the selectivity can be 99% or more, with an etch rate difference of 1:100 or greater.

In some embodiments $Al_2O_3$ films can selectively be etched relative to $SbO_x$ films or layers that have been deposited as described herein. Etching may be performed in gas phase or in liquid phase as a "wet etch". Exemplary selective etch solutions include $H_3PO_4$, HF, KOH and TMAH. Selectivity may be over 75% (etch rate difference of 1:3), over 80% (etch rate difference of 1:5), over 90% (etch rate difference of 1:10), and in some cases over 95% (etch rate difference of 1:20) or over 98% (etch rate difference of 1:50). In some cases a selectivity of 99% or more can be achieved, with an etch rate difference of 1:100 or greater.

In some embodiments silicon or silicon nitride is etched selectively relative to the $SbO_x$ films deposited by ALD as described herein. In these cases silicon or silicon nitride can be etched relative to $SbO_x$ using common silicon or silicon nitride etchants. $SbO_x$ can also be etched selectively relative to silicon or silicon nitride. For example, concentrated HCl, $H_2O_2$ or tartaric acid can be used. In some embodiments selectivity is over 75% (etch rate difference of 1:3), over 80% (etch rate difference of 1:5), over 90% (etch rate difference of 1:10), and even over 95% (etch rate difference of 1:20) or over 98% (etch rate difference of 1:50). In some cases a selectivity of 99% or more is achieved, with an etch rate difference of 1:100 or even more.

In some embodiments the $SbO_x$ films have etch selectivity against a different material or vice-versa—the other material can be etched selectively over $SbO_x$. In these cases other material can be etched selectively relative to $SbO_x$ using common known etchants. Also $SbO_x$ can also be etched selectively relative to the other material using concentrated HCl, $H_2O_2$ or tartaric acid. Selectivity may be over 75% (etch rate difference of 1:3), over 80% (etch rate difference of 1:5), over 90% (etch rate difference of 1:10), and in some cases over 95% (etch rate difference of 1:20) or over 98% (etch rate difference of 1:50). In some cases the selectivity can be 99% or more, with an etch rate difference of 1:100 or greater.

In some embodiments the $SbO_x$ films can be etched selectively over other materials such as SiN or $SiO_2$, using dry-etchants. For example, Cl and/or F-containing plasma etchants can be used. In some embodiments $Cl_2$-plasma or a mixture $CHF_3$ and $Cl_2$-plasma is used. Again, selectivity may be over 50% (etch rate difference of 1:2), over 75% (etch rate difference of 1:3), or even over 90% (etch rate difference of 1:10).

In some embodiments methods of forming a structure on a substrate, such as in multiple patterning processes, comprise depositing a first film comprising a first material and depositing a second film comprising antimony oxide. Although referred to as the first and second films, the first film may be deposited prior to the second film, or the second film may be deposited prior to the first film. In some embodiments the second film is deposited directly on the first film, while in other embodiments the first film is deposited directly on the second film. The antimony oxide film is deposited by an ALD process as described herein, for example by alternately and sequentially contacting the substrate with an antimony reactant, such as an antimony halide, antimony alkoxide or antimony alkylamine, and an oxygen source, such as ozone. The first film may then be selectively etched relative to the antimony oxide, or the antimony oxide may be selectively etched relative to the first film. In some embodiments the first material may be, for example, $SiO_2$ or $Al_2O_3$. When the second layer of antimony oxide is etched relative to the first layer, etching may comprise contacting the antimony oxide layer with an etchant selected from the group consisting of concentrated HCl, $H_2O_2$ and tartaric acid. When the first material is etched relative to the antimony oxide layer, etching may comprise contacting the first material with an etchant selected from the group consisting of HF, $H_3PO_4$, KOH and TMAH.

In some embodiments antimony oxide thin films are deposited using an ALD cycle comprising alternating and sequential pulses of an antimony alkoxide and an oxygen source, such as ozone. The antimony alkoxide may be, for example, $Sb(OEt)_3$. The films may be deposited in a batch reactor and may be used, for example, as a sacrificial layer or as an etch stop layer.

In some embodiments antimony oxide thin films are deposited by an ALD cycle comprising alternating and sequential pulses of an antimony alkylamine and an oxygen source, such as ozone. The films may be deposited in a batch reactor and may be used, for example, as a sacrificial layer or as an etch stop layer.

EXAMPLES

Example 1

$Sb(OEt)_3$ as the Antimony Source in a Single Wafer Reactor

Antimony oxide ($Sb_2O_3$) thin films were deposited by Atomic layer deposition (ALD) in an F-450 ALCVD™ reactor using $Sb(OC_2H_5)_3$ as the antimony source and $O_3$ as the oxygen source.

No film was obtained using Sb(OC2H5)3 (pulse 3.0 s, purge 5.0 s) and $H_2O$ (pulse 1.5 s, purge 5.0 s) at 300° C., but some film was obtained at 400° C. (growth rate ~0.02 Å/cycle).

Films were deposited using alternate and sequential pulses of $Sb(OC_2H_5)_3$ and $O_3$ at 100-350° C. $Sb(OEt)_3$ was pulsed for 3.0 s and purged for 5.0 s. $O_3$ was also pulsed for 3.0 s and purged for 5.0 s. The $Sb(OC_2H_5)_3$ was used at room temperature (21° C.).

Figure 2B:
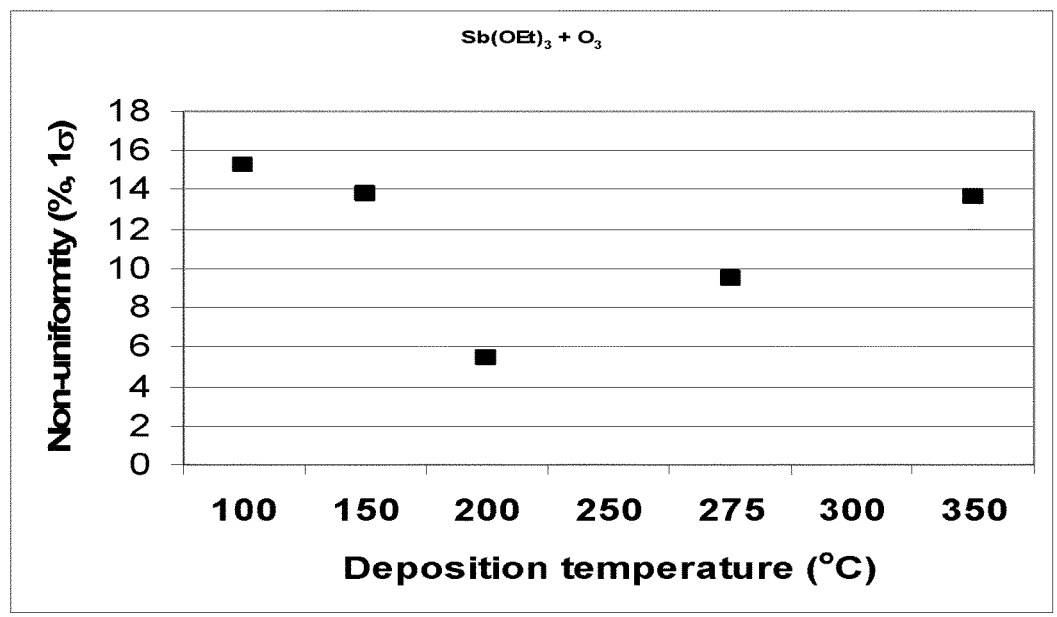
FIG. 2B shows film non-uniformity of $Sb_2O_3$ films deposited from $Sb(OEt)_3$ and $O_3$ as a function of temperature, as measured from 21 points using a spectroscopic ellipsometer.
Figure 2C:
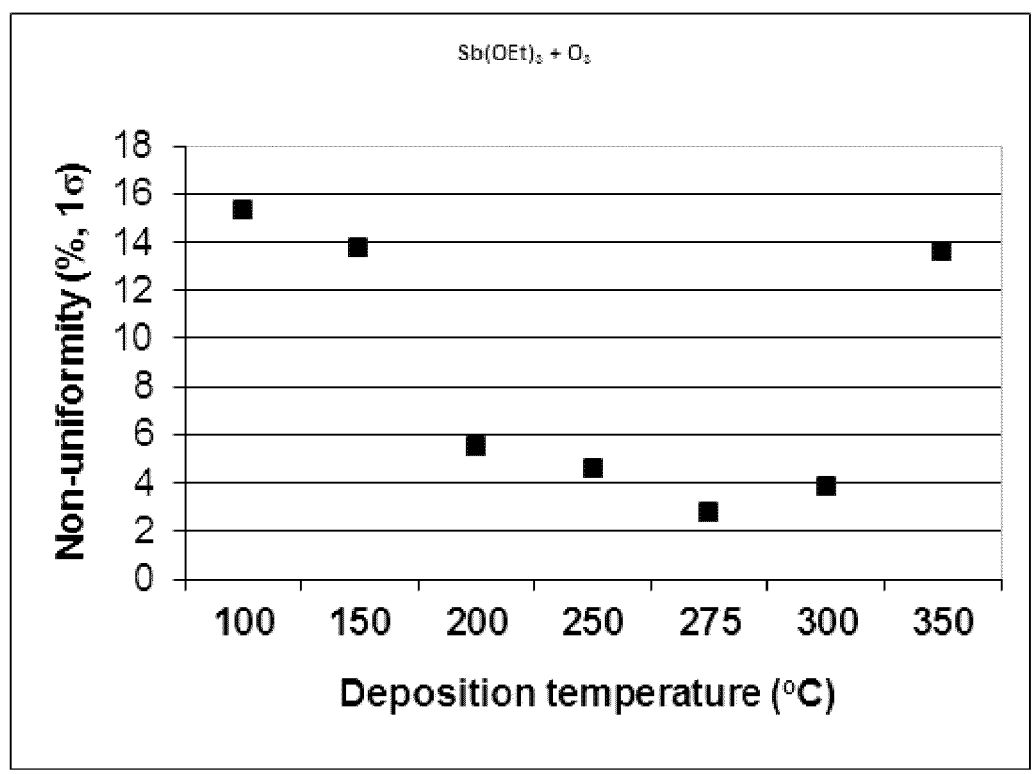
FIG. 2C also shows film non-uniformity of $Sb_2O_3$ films deposited from $Sb(OEt)_3$ and $O_3$ as a function of temperature.

The growth rate ranged from about 0.4 to 1.3 Å/cycle. The growth rate was 0.4-0.6 Å/cycle at 100-250° C., and >0.8 Å/cycle at 275-350° C. The film non-uniformity was high (>10% 1σ) at 100-150 and -350° C. At 200-300° C. the 1σ non-uniformity was <6% and at 275° C. being the lowest about 3%. FIGS. 2A-C show film growth rate and non-uniformity at 100-350° C.

Figure 3:
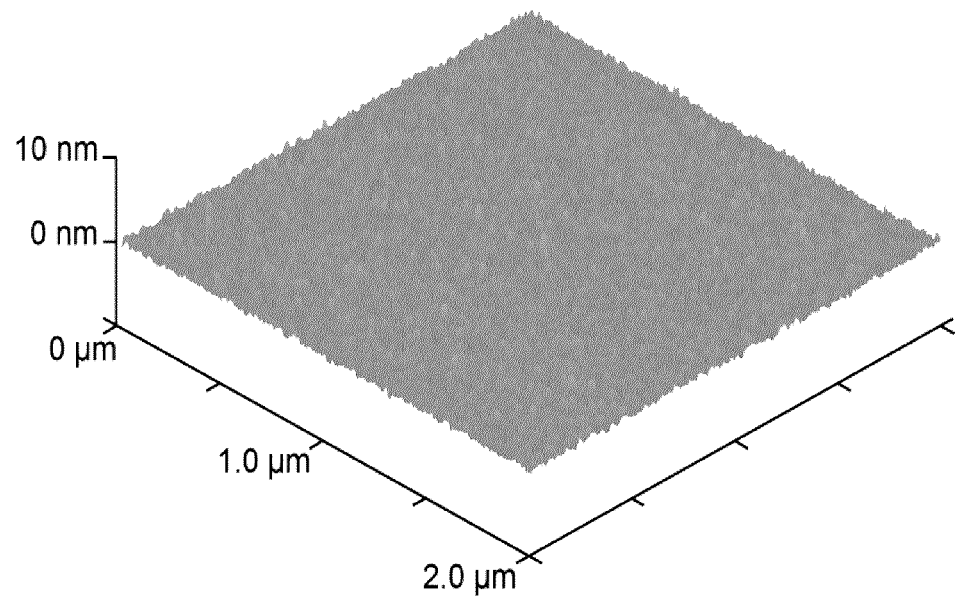
FIG. 3 shows an AFM image of a 25 nm $Sb_2O_3$ film deposited at 100° C.

The films were characterized with X-ray reflection (XRR), X-ray diffraction (XRD) and X-ray photoelectron spectroscopy (XPS), energy dispersive x-ray analysis (EDX) and atomic force microscopy (AFM). According to XRR, the film density was ~6-6.5 g/cm³ density increasing towards higher temperature (200-300° C.). The rms roughness obtained from XRR was about 1.4 nm (24-40 nm at 200-300° C.). A very weak peak that could be addressed to $Sb_2O_3$ was seen in the XRD diffractogram of a sample deposited at 150° C. AFM rms roughness was about 0.31 nm (~25 nm film deposited at 100° C.). The film was smooth and uniform, no contrast was seen in phase images (FIG. 3).

According to XPS (Table 1), the oxidation state of antimony is +3; thus the films were $Sb_2O_3$. Carbon and nitrogen were detected as contamination on the surface, but after sputtering ~5 nm neither could be detected. The oxygen concentrations were approximated due to overlap of O1s and Sb3d5 peaks. The decrease in O/Sb (Table 2) is believed to be due to preferential sputtering of the low mass oxygen relative to the high mass Sb. The XPS samples were deposited at 250° C. EDX detected carbon but no chlorine in a film deposited at 300° C.

Etching tests were done in 1% HF, 25% $H_2SO_4$, 2M NaOH, conc. $HNO_3$ and conc. HCl at room temperature. The film could be etched only with conc. HCl (etching rate ~10 nm/min). Additional etching tests were carried out using 1% HF, 37% HCl and 0.5M tartaric acid. Results are shown in Table 2 below.

TABLE 1

XPS results. $Sb_2O_3$ film deposited at 250° C. The figures present at. %. Measured before (top) and after (below) sputtering ~5 nm.

|  | C | N | Sb | O | O/Sb |
|---|---|---|---|---|---|
| Sample B | 14.8 | 2.5 | 55 | 28.2 | 1.9 |
| Sample B -5 nm | 0 | — | 42 | 57.6 | 0.7 |

As illustrated in FIG. 1, a $Sb_2O_3$ layer was deposited at 100° C. on structured photoresist. A thickness target of 30 nm was chosen and the deposition process comprised 750 cycles. In each cycle, Sb(OEt)₃ was pulsed for 3.5 s and purged for 5.0 s and O3 was pulsed for 3.0 s and purged for 5 s. Observed step coverage was greater than 95%. A k value of about 16 was observed.

TABLE 2

Etch results of Sb₂O₃ films deposited by using Sb(OEt)₃ and O₃ as reactants and reaction temperatures from about 100 to about 200° C.

| Solution | Temperature (etch solution) | etches Sb₂O₃ ? |
|---|---|---|
| 1% HF | RT | no |
| 37% HCl | RT | yes |
| 0.5M tartaric acid | 50° C. | yes |

Example 2

SbCl₃ as the Antimony Source in a Single Wafer Reactor

Antimony oxide (Sb₂O₃) thin films were deposited by Atomic layer deposition (ALD) in an F-450 ALCVD™ reactor using SbCl₃ as the antimony source and O₃ as the oxygen source. No film was obtained using H₂O as the oxygen source (SbCl3 pulse 2.0 s, purge 5.0 s; H₂O pulse 1.5 s, purge 5 s). However, the growth can be enhanced and uniformity increased by using H₂O in addition to O₃. A deposition cycle consisted of a SbCl3 pulse 2.0 s, purge 5 s; O3 pulse 3.0 s, purge 5 s; H₂O pulse 1.5 s, purge 5.0 s.

In each ALD cycle, SbCl3 was pulsed for 2 seconds and purged for 5 seconds, while ozone was pulsed for 3 seconds and purged for 5 seconds.

Films were deposited at 150-400° C. The evaporation temperature for SbCl₃ was 35° C. The growth rate was less than 0.3 Å/cycle. At temperatures below 250° C., the growth rate was <0.1 Å/cycle. Above 300° C. the growth rate was 0.2 Å/cycle. The highest growth rate was 0.28 Å/cycle at 400° C.

The film non-uniformity was about 6 to about 16%. Non-uniformity was high (>10% 1σ) at the low deposition temperatures (150-200° C.) and at the highest temperature 400° C. At 250-350° C. the 1σ non-uniformity was 5-7%.

Figure 4A:
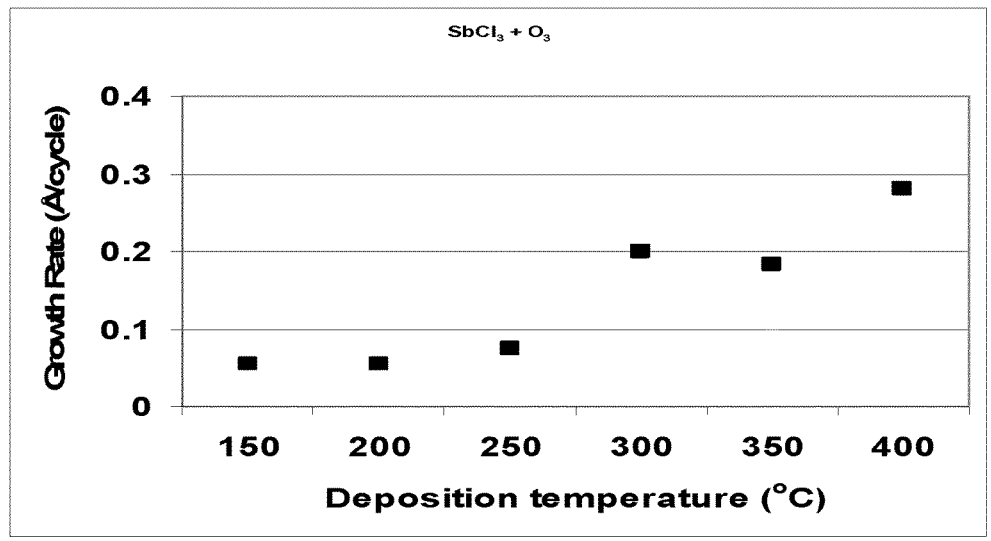
FIG. 4A shows the growth rate of $Sb_2O_3$ films deposited from $SbCl_3$ and $O_3$ as a function of temperature.
Figure 4B:
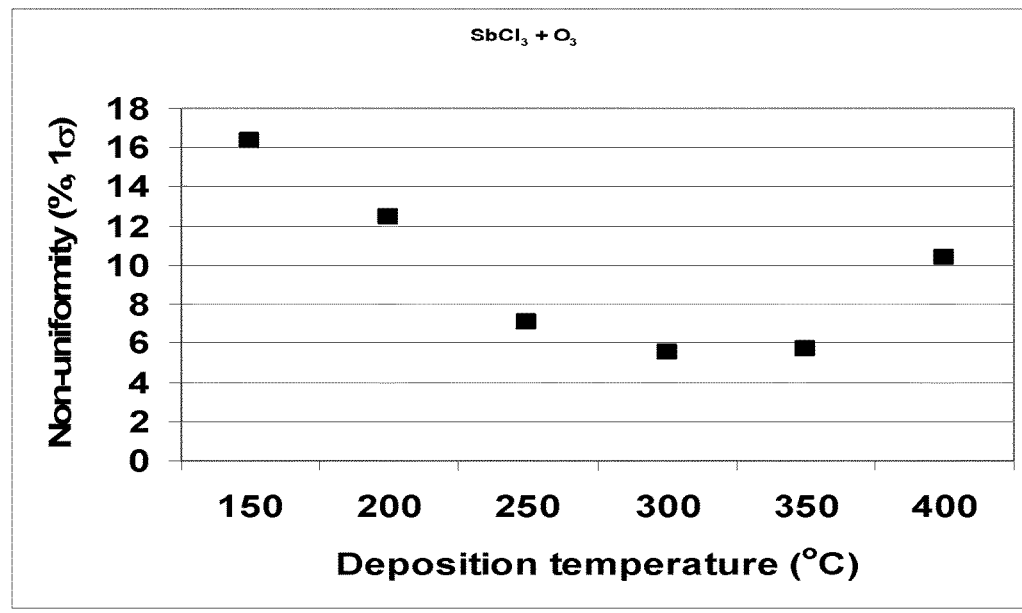
FIG. 4B shows film non-uniformity of $Sb_2O_3$ films deposited from $SbCl_3$ and $O_3$ as a function of temperature. Measurements were taken at 21 points using a spectroscopic ellipsometer.

FIG. 4 shows film growth rate and non-uniformity at 150-400° C. Table 3 presents how the addition of a H₂O pulse after or before the O₃ pulse affects the growth rate and non-uniformity.

TABLE 3

The effect of an additional H₂O pulse after or before the O₃ pulse on growth rate and film uniformity.

| | O₃ | | O₃ + H₂O | | H₂O + O₃ | |
|---|---|---|---|---|---|---|
| Temperature (° C.) | Growth rate (Å/cycle) | NU % | Growth rate (Å/cycle) | NU % | Growth rate (Å/cycle) | NU % |
| 400 | 0.28 | 10.4 | 0.38 | 7.4 | 0.38 | 6.4 |
| 300 | 0.2 | 5.5 | 0.37 | 7 | | |

The films were characterised with X-ray reflection (XRR), X-ray diffraction (XRD) and X-ray photoelectron spectroscopy (XPS) and energy dispersive x-ray analysis (EDX). According to XRR, the film density was ~6-6.6 g/cm³ density increasing towards higher temperature (150 to 400° C.). The rms roughness obtained from XRR was 1.3 nm (6 nm at 150° C.), 1.0 (20 nm at 300° C.) and 1.2 nm at 400° C. No clear peaks were seen in the XRD diffractogram with a sample deposited at 400° C.; hence the films were assumed amorphous. According to XPS (Table 4), the oxidation state of antimony is +3; thus the films were Sb₂O₃. Carbon and nitrogen were detected as contamination on the surface, but after sputtering ~5 nm neither could be detected. The oxygen concentrations were approximated due to overlap of O1s and Sb3d5 peaks. The decrease in O/Sb (Table 4) is believed to be due to preferential sputtering of the low mass oxygen relative to the high mass Sb. The XPS samples were deposited at 400° C. EDX detected no carbon or chlorine in a film deposited at 400° C.

Etching tests were done in 1% HF, 25% H₂SO₄, conc. HNO₃ and conc. HCl at room temperature. The film could not be etched in any of these solutions (1-6 min etching time, with an initial film thickness of about 40 nm).

TABLE 4

XPS results. Sb₂O₃ film deposited at 400° C. The figures present at. %. Measured before (top) and after (below) sputtering ~5 nm.

| | C | N | O | Sb | O/Sb |
|---|---|---|---|---|---|
| Sample A | 14.7 | 2 | 56 | 27.6 | 2 |
| Sample A -5 nm | 0 | — | 39 | 60.9 | 0.6 |

Example 3

Sb(N(CH₃)₂)₃ as the Antimony Source in a Single Wafer Reactor

Antimony oxide (SbO$_x$) thin films were deposited by Atomic layer deposition (ALD) in a Pulsar® 2000 R&D reactor using Sb(N(CH₃)₂)₃ as the antimony source and O₃ as the oxygen source.

Films were deposited using alternate and sequential pulses of Sb(N(CH₃)₂)₃ and O₃ (in O₂) at reaction temperature of about 100-300° C. Sb(N(CH₃)₂)₃ was pulsed for 0.1-1.0 s and purged for 10 s. O₃ was pulsed for 10 s and purged for 10 s, O₃ concentration was 250 g/m³(NTP). The Sb(N(CH₃)₂)₃ was used at room temperature (about 20° C. to about 23° C.). Carrier gas flow was 0.8 slm.

Figure 5:
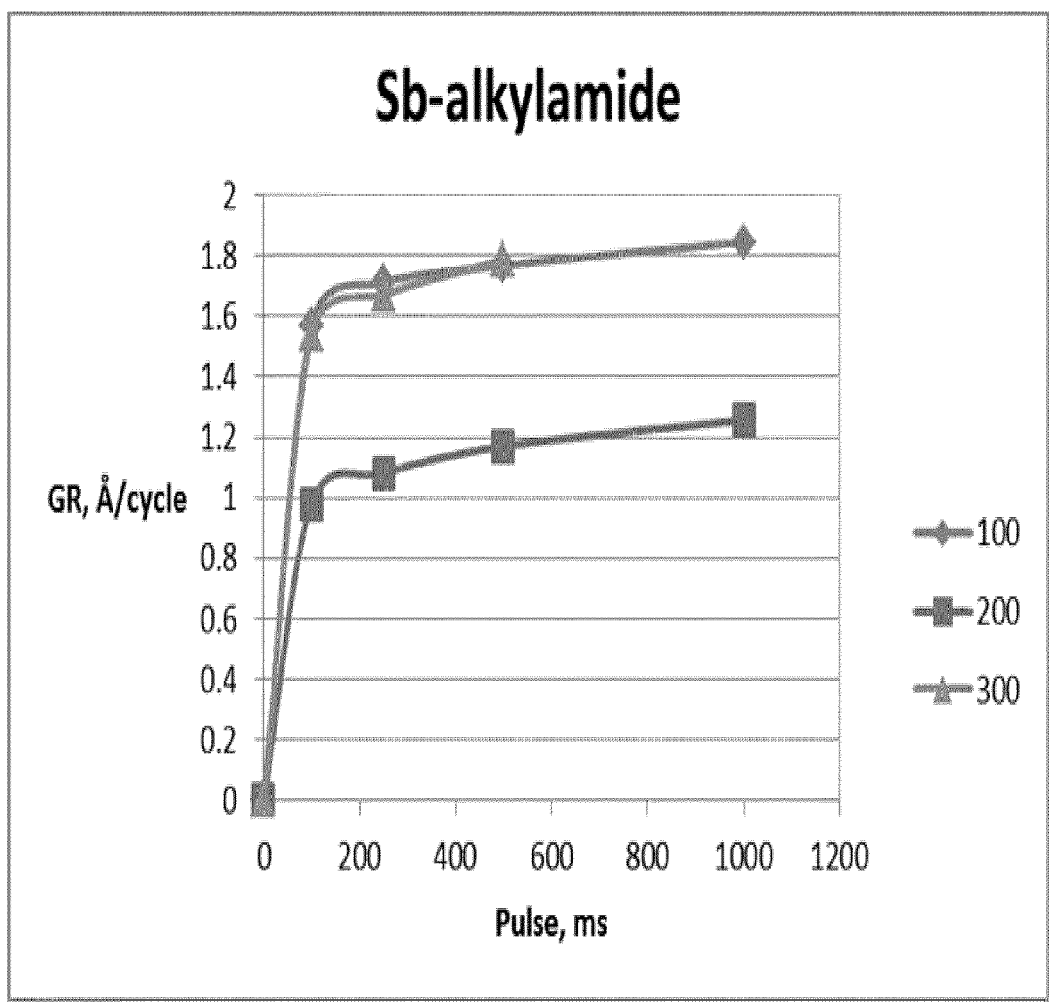
FIG. 5 illustrates the growth rate of $SbO_x$ as a function of $Sb(N(CH_3)_2)_3$ pulse time.
Figure 6:
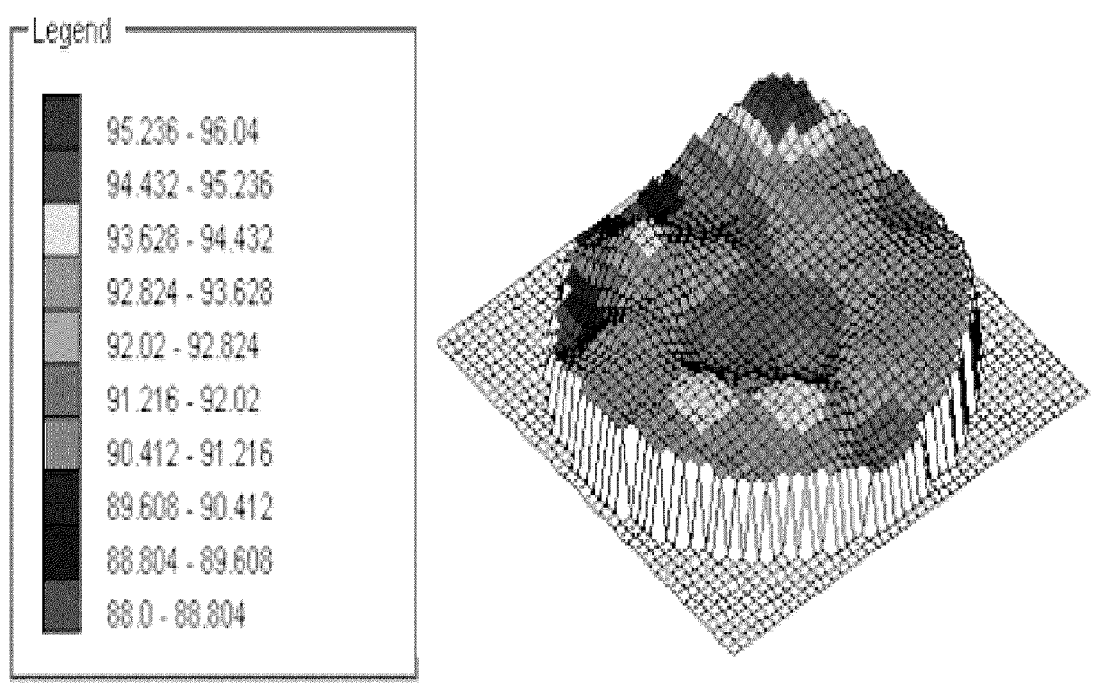
FIG. 6 shows the thickness profile (nm) of $SbO_x$ deposited at 100° C. from $Sb(N(CH_3)_2)_3+O_3$.

The growth rate ranged from about 0.83 to 1.92 Å/cycle. The growth rate was about 1.44-1.92 Å/cycle at around 100° C. and from about 0.83 to about 1.39 Å/cycle at 200° C. The film non-uniformity (with-in-wafer) varied from about 2.1% to about 7.1% (1σ). For example, a 500 cycle film deposited at 100° C. and with the Sb(N(CH₃)₂)₃ pulse 1 s, purge 10 s and O₃ pulse 10 s, purge 10 s, concentration 250 g/m³(NTP) had a growth rate of 1.92 Å/cycle and with-in-wafer uniformity of 2.1% (1σ). FIGS. 5 and 6 present typical SbO$_x$ film characteristics with Sb(N(CH₃)₂)₃+O₃.

Example 4

Sb(OEt)₃ as the Antimony Source in a Batch Reactor

Antimony oxide (SbO$_x$) thin films were deposited by atomic layer deposition (ALD) in an commercial, production-type ASM A412™ batch reactor using Sb(OC$_2$H$_5$)$_3$ as the antimony source and O$_3$ as the oxygen source.

Films were deposited using alternate and sequential pulses of Sb(OC$_2$H5)$_3$ and O$_3$ at a reaction temperature of about 140-220° C. Sb(OEt)$_3$ was pulsed for 3.0-20 s with doses of 15-40 g/hr and purged for 10-60 s. O$_3$ was also pulsed for 3.0-20 s and purged for 10-600 s. The Sb(OC$_2$H$_5$)$_3$ was used at 120° C. in liquid injection system. Carrier gas flow was varied from about 0.5 slm to about 0.8 slm. Both single pitch and double pitch wafer loads were used, corresponding to 100 or 50 product wafer capacity, respectively.

The growth rate ranged from about 0.38 to 0.8 Å/cycle. The growth rate was about 0.38-0.41 Å/cycle at around 140° C. and from about 0.5 to about 0.8 Å/cycle at 200-220° C. The film non-uniformity (with-in-wafer) varied from about 3.4% to about 13% (1σ) and wafer-to-wafer uniformity varied from about 0.1% to about 3.9% (1σ). For example, a 200 cycle film deposited with double pitch loading at 200° C. and with the Sb(OEt)$_3$ pulse 5 s, dose 25 g/h, purge 10 s and O$_3$ pulse 5 s, purge 600 s, concentration 350 g/m³ had a growth rate of 0.63 Å/cycle, with-in-wafer uniformity of 3.4% (1σ) and wafer-to-wafer uniformity of 0.39 (1σ).

Example 5

Sb(OEt)₃ as the Antimony Source in a Single Wafer Reactor

Antimony oxide (SbO$_x$) thin films were deposited by atomic ayer deposition (ALD) in Pulsar® 2000 R&D reactor using Sb(OC$_2$H$_5$)$_3$ as the antimony source and O$_3$ as the oxygen source.

Films were deposited using alternate and sequential pulses of Sb(OC$_2$H5)$_3$ and O$_3$ at reaction temperature of about 200° C. Sb(OEt)$_3$ pulse was fixed to 0.5 s and purge to 10 s. O$_3$ was pulsed for 2.5-30 s and purged for 10 s, O$_3$ concentration was 60-300 g/m³(NTP) and the O$_3$ flow into the reactor was 200-800 cm³/min(NTP). The Sb(OC$_2$H$_5$)$_3$ was heated to 40° C. Carrier gas flow was 0.8 slm.

Figure 7:
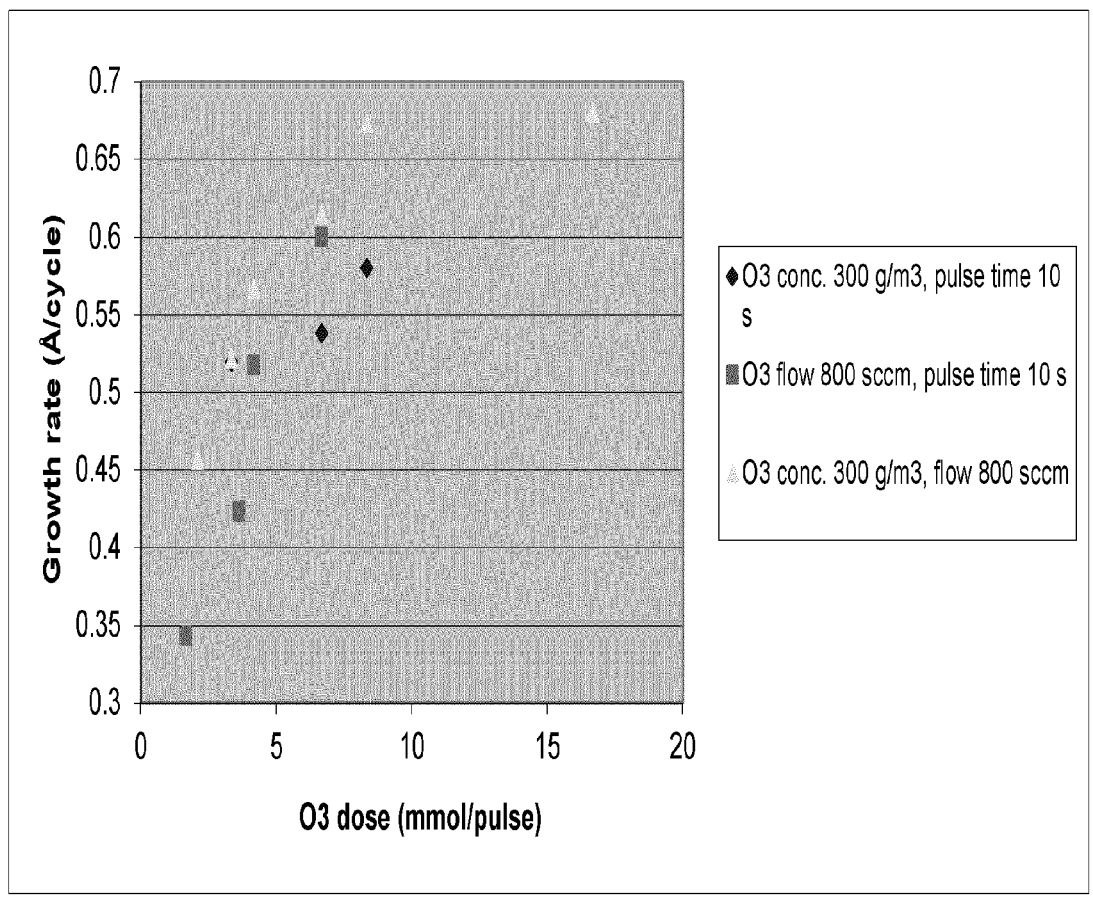
FIG. 7 illustrates the growth rate of $SbO_x$ from $Sb(OEt)_3$ and $O_3$ as a function of the estimated $O_3$ dosage injected in the reactor.

The growth rate ranged from about 0.3 to 0.7 Å/cycle. The growth rate depended heavily on the O$_3$ dosage used as shown in FIG. 7, where diamonds present the runs where the O$_3$ flow in the reactor was varied, squares present the runs where the O$_3$ concentration was varied, and triangles present the runs where the O$_3$ pulse time was varied. The film non-uniformity (with-in-wafer) varied from about 2.7% to about 49.5% (16). Higher O$_3$ dosage resulted in higher growth rate of the film.

Example 6

Sb(N(CH₃)₂)₃ as the Antimony Source in a Batch Reactor

Antimony oxide (SbO$_x$) thin films were deposited by atomic layer deposition (ALD) in an commercial, production-type ASM A412™ batch reactor using Sb(N(CH$_3$)$_2$)$_3$ as the antimony source and O$_3$ as the oxygen source.

Films were deposited using alternate and sequential pulses of Sb(N(CH$_3$)$_2$)$_3$ and O$_3$ at a reaction temperature of about 200° C. Sb(N(CH$_3$)$_2$)$_3$ was pulsed for 5.0 s with a dose of 50 g/hr and purged for 120 s. O$_3$ was also pulsed for 5.0 s and purged for 120 s with concentration of 350 g/m³. Sb(N(CH$_3$)$_2$)$_3$ was used at 120° C. in a liquid injection system. Carrier gas flow was 0.5 slm.

Figure 8:
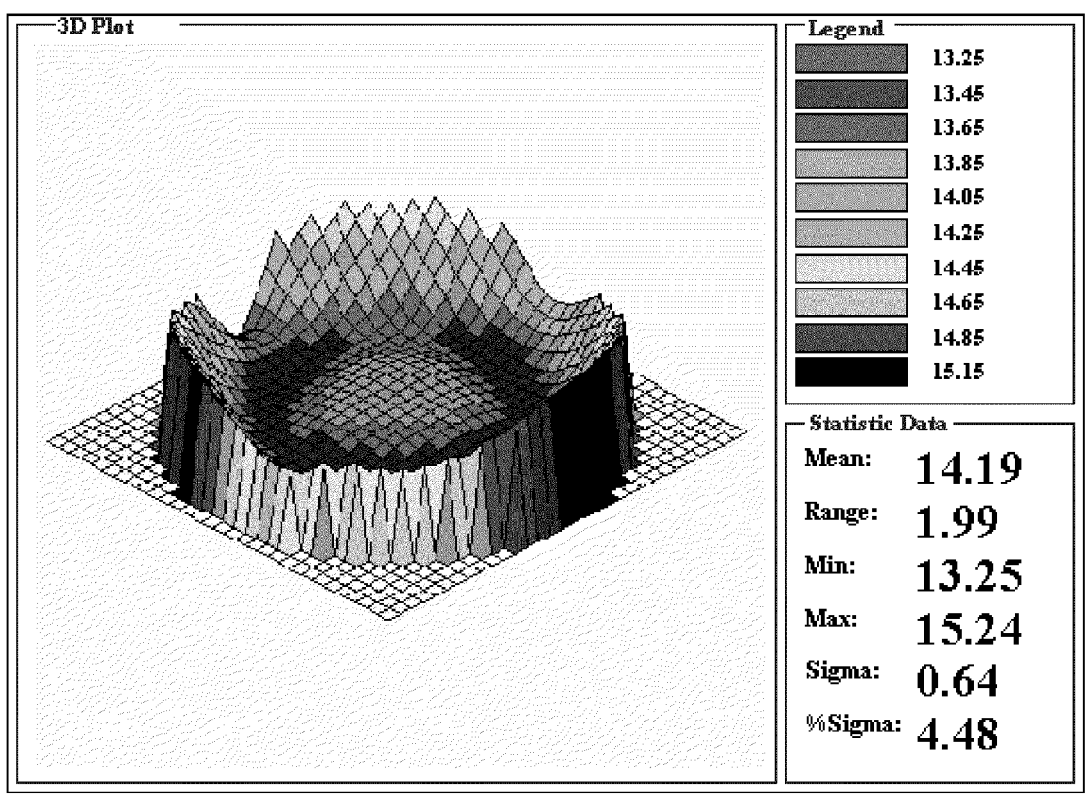
FIG. 8 is a thickness non-uniformity map of an $SbO_x$ film deposited using the conditions described in Example 6.

The growth rate of SbO$_x$ ranged from about 1.3 to 1.4 Å/cycle. The film non-uniformity (with-in-wafer) varied from about 4.5% to about 5.3% (1σ). A 4.5% film thickness non-uniformity map can be seen in FIG. 8.

What is claimed is:

1. A vapor deposition process for depositing an antimony oxide thin film, comprising alternately and sequentially contacting a substrate in a reaction chamber with a vapor phase antimony source and a vapor phase oxygen source, wherein the antimony source has an oxidation state of +III or +V.

2. The process of claim 1, wherein the process is an atomic layer deposition (ALD) process.

3. The process of claim 2, wherein the process is a thermal ALD process.

4. The method of claim 1, wherein the oxygen source is selected from the group consisting of water, oxygen, hydrogen peroxide, aqueous solution of hydrogen peroxide, ozone, atomic oxygen, oxides of nitrogen, peracids (—O—O—H), alcohols, oxygen-containing radicals and mixtures thereof.

5. The method of claim 4, wherein the oxygen source comprises ozone.

6. The method of claim 1, further comprising exposing the substrate to water.

7. The method of claim 6, wherein the substrate is exposed to water subsequent to contacting the substrate with the antimony source and prior to contacting the substrate with the oxygen source.

8. The process of claim 1, wherein the antimony source has the formula SbX$_z$A$_{3-z}$, wherein X is a halide, z is from 1 to 3, and A is a ligand comprising alkylamine, a halide different from X, or an amine, silyl, alkoxide or alkyl group.

9. The process of claim 8, wherein the antimony source comprises SbCl$_3$, SbBr$_3$, SbF$_3$, or SbI$_3$.

10. The process of claim 9, wherein the antimony source is SbCl$_3$.

11. An atomic layer deposition (ALD) process for depositing an antimony oxide thin film on a substrate in a reaction space, the process comprising:
   contacting the substrate with a vapor phase antimony precursor comprising an antimony halide such that an antimony compound adsorbs to the substrate, wherein the antimony halide has an oxidation state of +III or +V; and
   contacting the substrate with an oxygen source to thereby convert the adsorbed antimony compound into antimony oxide.

12. The process of claim 11, wherein the antimony precursor has the formula SbX$_z$A$_{3-z}$, wherein X is a halide, z is from 1 to 3, and A is a ligand comprising alkylamine, a halide different from X, or an amine, silyl, alkoxide or alkyl group.

13. The method of claim 11, wherein the oxygen source comprises ozone.

14. The method of claim 11, wherein the oxygen source is not water.

15. The method of claim 11, wherein exposing the substrate to the oxygen source comprises exposing the substrate to an oxygen-containing gas pulse, wherein the oxygen-containing gas pulse comprises the oxygen source and an inactive gas.

16. The method of claim 15, wherein the oxygen source comprises at least one of oxygen and ozone, and wherein the inactive gas comprises nitrogen or argon.

17. The process of claim 11, wherein the contacting steps comprise a deposition cycle, the process comprising multiple deposition cycles.

18. The process of claim 17, further comprising repeating the deposition cycle until an antimony oxide film of a desired thickness has been formed.

19. The process of claim 17, the deposition cycle further comprising removing excess antimony precursor and reaction byproducts, if any, from the substrate subsequent to contacting the substrate with the vapor phase antimony precursor and prior to a subsequent contacting step.

20. The process of claim 17, the deposition cycle further comprising removing excess oxygen source and reaction byproducts, if any, from the substrate subsequent to contacting the substrate with the oxygen source and prior to a subsequent contacting step.

* * * * *